(12) United States Patent
Yoon et al.

(10) Patent No.: US 9,601,466 B2
(45) Date of Patent: Mar. 21, 2017

(54) SEMICONDUCTOR PACKAGE AND METHOD OF MANUFACTURING THE SAME

(71) Applicant: Samsung Electronics Co., Ltd., Suwon-si, Gyeonggi-do (KR)

(72) Inventors: Jeongwon Yoon, Suwon-si (KR); Boin Noh, Suwon-si (KR); Baikwoo Lee, Gwangmyeong-si (KR); Hyunsuk Chun, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 89 days.

(21) Appl. No.: 14/725,268

(22) Filed: May 29, 2015

(65) Prior Publication Data
US 2016/0071824 A1 Mar. 10, 2016

(30) Foreign Application Priority Data
Sep. 4, 2014 (KR) .................. 10-2014-0117797

(51) Int. Cl.
*H01L 23/02* (2006.01)
*H01L 25/065* (2006.01)
(Continued)

(52) U.S. Cl.
CPC .... *H01L 25/0657* (2013.01); *H01L 23/49827* (2013.01); *H01L 24/06* (2013.01); *H01L 24/17* (2013.01); *H01L 25/50* (2013.01); *H01L 2224/0401* (2013.01); *H01L 2224/06181* (2013.01); *H01L 2224/1316* (2013.01); *H01L 2224/1317* (2013.01); *H01L 2224/1318* (2013.01); *H01L 2224/13082* (2013.01); *H01L 2224/13111* (2013.01); *H01L 2224/13123* (2013.01); *H01L 2224/13124* (2013.01);
(Continued)

(58) Field of Classification Search
CPC ... H01L 25/18; H01L 25/105; H01L 25/0657; H01L 2224/16225; H01L 2224/3225; H01L 2224/73265; H01L 2224/48091; H01L 2224/48227; H01L 2224/73204; H01L 2224/32145
USPC ........ 257/787, 788, 790, 666, 777, 778, 685
See application file for complete search history.

(56) References Cited

U.S. PATENT DOCUMENTS

| 6,362,090 B1 | 3/2002 | Paik et al. |
| 7,276,801 B2 | 10/2007 | Dubin et al. |

(Continued)

FOREIGN PATENT DOCUMENTS

| JP | 07223092 | 8/1995 |
| JP | H07223092 A | 8/1995 |

(Continued)

*Primary Examiner* — (Vikki) Hoa B Trinh
(74) *Attorney, Agent, or Firm* — Onello & Mello, LLP.

(57) ABSTRACT

Provided is a semiconductor package and a method of making same, including a first package substrate; a first semiconductor chip mounted on the first package substrate and having a first pad and a second pad, wherein the first pad is provided on a top of the first semiconductor chip and the second pad is provided on a bottom of the first semiconductor chip, the bottom being an opposite surface of the top; and a clad metal provided on the first pad and electrically connecting the first semiconductor chip to one of a second semiconductor chip and second package substrate provided on the top of the first semiconductor chip.

15 Claims, 10 Drawing Sheets

(51) Int. Cl.
  *H01L 23/00*       (2006.01)
  *H01L 23/498*      (2006.01)
  *H01L 25/00*       (2006.01)
(52) U.S. Cl.
  CPC ............ *H01L 2224/13139* (2013.01); *H01L 2224/13144* (2013.01); *H01L 2224/13147* (2013.01); *H01L 2224/13155* (2013.01); *H01L 2224/13163* (2013.01); *H01L 2224/13164* (2013.01); *H01L 2224/13166* (2013.01); *H01L 2224/13169* (2013.01); *H01L 2224/13181* (2013.01); *H01L 2224/13184* (2013.01); *H01L 2224/16145* (2013.01); *H01L 2224/16227* (2013.01); *H01L 2224/818* (2013.01); *H01L 2224/81205* (2013.01); *H01L 2225/06513* (2013.01); *H01L 2225/06517* (2013.01); *H01L 2225/06541* (2013.01); *H01L 2225/06565* (2013.01); *H01L 2225/06572* (2013.01); *H01L 2225/06589* (2013.01); *H01L 2924/01004* (2013.01); *H01L 2924/01014* (2013.01); *H01L 2924/01032* (2013.01); *H01L 2924/15311* (2013.01)

(56) References Cited

U.S. PATENT DOCUMENTS

| | | |
|---|---|---|
| 7,679,133 B2 | 3/2010 | Son et al. |
| 8,026,588 B2 | 9/2011 | Lee et al. |
| 8,120,176 B2 | 2/2012 | Shin et al. |
| 8,395,261 B2 | 3/2013 | Tanaka et al. |
| 8,456,018 B2 | 6/2013 | Park et al. |
| 8,508,043 B2 | 8/2013 | Daubenspeck et al. |
| 8,553,466 B2 | 10/2013 | Han et al. |
| 8,559,235 B2 | 10/2013 | Yoon et al. |
| 8,653,667 B1 | 2/2014 | Zommer |
| 8,654,587 B2 | 2/2014 | Yoon et al. |
| 2005/0062169 A1 | 3/2005 | Dubin et al. |
| 2007/0273031 A1 | 11/2007 | Lee et al. |
| 2008/0284009 A1 | 11/2008 | Min |
| 2009/0032942 A1 | 2/2009 | Choi |
| 2009/0102037 A1* | 4/2009 | Kim ............. H01L 23/49827 257/686 |
| 2009/0121271 A1 | 5/2009 | Son et al. |
| 2010/0230811 A1 | 9/2010 | Shin et al. |
| 2011/0216603 A1 | 9/2011 | Han et al. |
| 2011/0233648 A1 | 9/2011 | Seol et al. |
| 2012/0051143 A1 | 3/2012 | Yoon et al. |
| 2012/0104625 A1 | 5/2012 | Park et al. |
| 2012/0273942 A1 | 11/2012 | Uchida |
| 2012/0306077 A1 | 12/2012 | Tanaka et al. |
| 2013/0119534 A1 | 5/2013 | Daubenspeck et al. |
| 2013/0279262 A1 | 10/2013 | Yoon et al. |
| 2013/0306985 A1 | 11/2013 | Fujii |
| 2014/0042624 A1 | 2/2014 | Zommer |

FOREIGN PATENT DOCUMENTS

| | | |
|---|---|---|
| JP | 2735022 | 1/1998 |
| JP | 10247651 | 9/1998 |
| JP | 10261645 | 9/1998 |
| JP | H10247651 A | 9/1998 |
| JP | H10261645 A | 9/1998 |
| JP | 11198796 | 10/2011 |
| JP | 2011198796 A | 10/2011 |
| JP | 5423177 | 12/2013 |
| KR | 0166827 | 1/1999 |
| KR | 100166827 B1 | 1/1999 |
| KR | 100694428 | 3/2007 |
| KR | 100820365 | 3/2008 |
| KR | 1020080020365 | 3/2008 |

\* cited by examiner

SEMICONDUCTOR PACKAGE AND METHOD OF MANUFACTURING THE SAME

CROSS-REFERENCE TO RELATED APPLICATIONS

This U.S. non-provisional patent application claims priority under 35 U.S.C. §119 of Korean Patent Application No. 10-2014-0117797, filed on Sep. 4, 2014, the entire contents of which are hereby incorporated by reference.

FIELD OF INVENTION

The inventive concept relates to a semiconductor package and a method of manufacturing a semiconductor package, and more particularly, to a package including a semiconductor chip mounted by using a clad metal and a method of manufacturing the same. The inventive method may further relate to a method of making, implementing, and using same, as well as methods of its operation.

BACKGROUND

A semiconductor package is configured in such a manner that semiconductor chips are mounted on a substrate and electrically connected by using an appropriate method. The electrical connection of the semiconductor package includes the electrical connection of element-to-element, element-to-substrate, substrate-to-lead frame, and substrate-to-terminal, and wire bonding, ribbon bonding or clip bonding are generally used.

For electrical signal transmission and effective heat emission from the semiconductor chip, aluminum (Al), copper (Cu), an alloy thereof having high electrical conductivity and heat conductivity or a plating layer disposed on the alloy may be generally used as the package substrate of the semiconductor package.

In manufacturing a typical semiconductor package, a soldering process such as a die-attach process and a wire bonding process such as an interconnection process are generally used. However, since the semiconductor package manufactured by using these processes emits heat from only a surface of the package, an associated disadvantage is the inefficient emission of heat from the package. In addition, since it is difficult to perform a direct soldering process on the pad of the semiconductor chip, a further disadvantage is that there is a need to perform a zincation process and an electroless nickel immersion gold (ENIG) plating process on the pad, or there is a need to perform an expensive Ti/Cu process on the pad.

Thus, there is a need for a method of manufacturing a semiconductor package that may simplify a process of manufacturing the semiconductor package and reduce costs.

SUMMARY

In accordance with aspects of the inventive concept, a semiconductor package and method of manufacturing a semiconductor package are provided, which reduce the costs of semiconductor package processes, enhance the strength of a bonding portion, reduce thermal resistance, and enhance the heat emission capability of the semiconductor package.

According to an aspect of the inventive concept, there is provided a semiconductor package including a first package substrate, a first semiconductor chip mounted on the first package substrate and having a first pad and a second pad. The first pad is provided on a top of the first semiconductor chip and the second pad is provided on a bottom of the first semiconductor chip, the bottom being an opposite surface of the top. A clad metal is provided on the first pad and electrically connects the first semiconductor chip to one of a second semiconductor chip and a second package substrate provided on the top of the first semiconductor chip.

In various embodiments, the clad metal may include at least a first layer of metal and a second layer of metal. The first layer of metal with which the clad metal may be in contact with the first pad may be formed of the same type of metal as the first pad.

In various embodiments, the semiconductor package may further include a solder ball provided between the second layer of metal and a second pad of one of the second semiconductor chip and the second package substrate connected thereto.

In various embodiments, a recess may be formed in the second layer of metal being in contact with the solder ball.

In various embodiments, the clad metal and the first semiconductor chip may be connected by ultrasonic bonding.

In various embodiments, the clad metal and one of the second semiconductor chip or the second package substrate may be connected by ultrasonic bonding or adhesive bonding.

In various embodiments, the second layer of metal at which the clad metal is in contact with the second pad may be formed of the same type of metal as the second pad.

In various embodiments, the first layer of metal and the second layer of metal may be homogeneous or heterogeneous.

In various embodiments, the first layer of metal and the second layer of metal may be selected from one of aluminum (Al), beryllium (Be), copper (Cu), germanium (Ge), gold (Au), iron (Fe), magnesium (Mg), molybdenum (Mo), nickel (Ni), palladium (Pd), platinum (Pt), silicon (Si), silver (Ag), tantalum (Ta), tin (Sn), titanium (Ti), tungsten (W), orzirconium (Zr), or a combination of two or more thereof.

In various embodiments, the clad metal may be formed by at least one of cladding, laminating, sputtering and plating.

According to another aspect of the inventive concept, a method of manufacturing a semiconductor package includes providing a first semiconductor chip mounted on a first package substrate and having a first pad and a second pad. The first pad is provided on a top of the first semiconductor chip and the second pad is provided on a bottom of the first semiconductor chip, the bottom being an opposite surface of the top. A a clad metal is provided electrically connecting the first semiconductor chip to one of a second semiconductor chip and a second package substrate provided on the top of the first semiconductor chip. The clad metal includes at least a first layer of metal and a second layer of metal, and the first layer of metal may be connected to the first pad.

In various embodiments, the method may further include providing the second semiconductor chip or the second package substrate directly on the top of the first semiconductor chip.

In various embodiments, the method may further include forming a recess in the clad metal and providing a solder ball on the clad metal having the recess.

In various embodiments, the method comprises connecting the second semiconductor chip or the second package substrate to the top of the first semiconductor chip by ultrasonic bonding or adhesive bonding.

In various embodiments, the first layer of metal and the second layer of metal may be selected from one of aluminum (Al), beryllium (Be), copper (Cu), germanium (Ge), gold (Au), iron (Fe), magnesium (Mg), molybdenum (Mo), nickel (Ni), palladium (Pd), platinum (Pt), silicon (Si), silver (Ag), tantalum (Ta), tin (Sn), titanium (Ti), tungsten (W), or zirconium (Zr), or a combination of two or more thereof.

According to another aspect of the inventive concept, there is provided a semiconductor package including a first semiconductor chip having a first pad at a first surface thereof and a clad metal provided on the first pad and electrically connecting the first semiconductor device to a recess.

In various embodiments, the component comprises one of a second semiconductor chip and a package substrate.

In various embodiments, the clad metal comprises at least a first layer of metal and a second layer of metal, the first layer of metal with which the clad metal is in contact with the first pad being formed of a same type of metal as the first pad.

In various embodiments, a solder ball is provided between the second layer of metal and a second pad of the one of the second semiconductor chip and the package substrate connected thereto.

In various embodiments, a groove is formed in the second layer of metal being in contact with the solder ball.

In still other embodiments of the inventive concept, semiconductor packages include: a first package substrate; at least one semiconductor chip mounted on the first package substrate and having a first pad and a second pad, wherein the first pad is provided on a top of the first semiconductor chip and the second pad is provided on a bottom of the first semiconductor chip, the bottom being an opposite surface of the top; and a clad metal provided on the first pad of the at least one semiconductor chip to electrically connect the at least one semiconductor chip to a semiconductor chip or second package substrate provided on the top of the at least one semiconductor chip, wherein the clad metal includes at least one layer of metal.

In some embodiments, the clad metal may include a first layer of metal and a second layer of metal, and the first layer of metal at which the clad metal is in contact with the first pad may be formed of the same metal as the first pad.

In other embodiments, the semiconductor packages may further include a solder ball provided between semiconductor chips when the at least one semiconductor chip is provided in plurality, wherein a groove is formed in the second layer of metal being in contact with the solder ball.

In still other embodiments, the first layer of metal and the second layer of metal may be selected from a group consisting of aluminum (Al), beryllium (Be), copper (Cu), germanium (Ge), gold (Au), iron (Fe), magnesium (Mg), molybdenum (Mo), nickel (Ni), palladium (Pd), platinum (Pt), silicon (Si), silver (Ag), tantalum (Ta), tin (Sn), titanium (Ti), tungsten (W) and zirconium (Zr). In even other embodiments, the second layer of metal at which the clad metal is in contact with the second pad may be formed of the same metal as the second pad.

BRIEF DESCRIPTION OF THE DRAWINGS

Exemplary embodiments of one or more new and useful process, machine, manufacture, and/or improvement thereof, in accordance with the inventive concept, are provided in the following detailed description taken in conjunction with the accompanying drawings, in which.

DETAILED DESCRIPTION OF THE EMBODIMENTS

Figure 1:
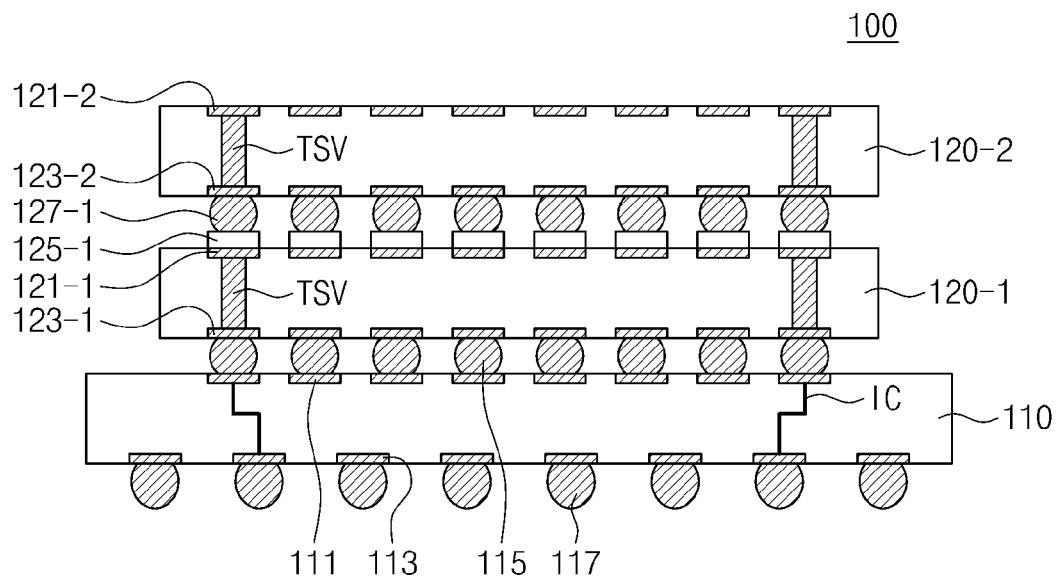
FIG. 1 is a cross-sectional view of an embodiment of a semiconductor package according to aspects of the inventive concept.

Aspects of the inventive concept will now be described more fully with reference to the accompanying drawings, in which exemplary embodiments are shown. The inventive concept may, however, be embodied in many different forms and should not be construed as limited to the exemplary embodiments set forth herein. Reference numerals are denoted in detail in the exemplary embodiments of the inventive concept and their examples are indicated in the accompanying drawings. The same reference numerals are used in the description and drawings in order to refer to the same or similar parts wherever possible.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

To the extent that functional features, operations, and/or steps are described herein, or otherwise understood to be included within various embodiments of the inventive concept, such functional features, operations, and/or steps can be embodied in functional blocks, units, modules, operations and/or methods. And to the extent that such functional blocks, units, modules, operations and/or methods include computer program code, such computer program code can be stored in a computer readable medium, e.g., such as non-transitory memory and media, that is executable by at least one computer processor.

According to one embodiment of the present inventive concept, a three dimensional (3D) memory array may be provided. The 3D memory array may be monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array may include vertical NAND strings that are vertically oriented such that at least one memory cell is located on or over another memory cell. The at least one memory cell may comprise a charge trap layer, in some embodiments.

The following patent documents, which are hereby incorporated in their entirety by reference, describe suitable configurations for three-dimensional memory arrays, in which a three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Exemplary embodiments according to aspects of the inventive concept are described below with reference to the accompanying drawings so that a person skilled in the art may easily accomplish the technical spirits of the inventive concept.

FIG. 1 is a cross-sectional view of an embodiment of a semiconductor package according to aspects of the inventive concept. Referring to FIG. 1, the semiconductor package 100 may include a package substrate 110, and a plurality of semiconductor chips 120-1 and 120-2 that are mounted on the package substrate 110. Although FIG. 1 shows that two semiconductor chips are mounted on the package substrate 110, the number of mounted semiconductor chips has no such limitation, so the number could be more than two.

The package substrate 110 has a top surface and a bottom surface and may include bonding pads 111, internal wirings IC and external connection pads 113. The bonding pads 111 may be arranged at the top surface of the package substrate 110 and the external connection pads 113 may be arranged at the bottom surface of the package substrate 110. The bonding pads 111 may be electrically connected to the external connection pads 113 through the internal wirings IC. External connection terminals 117, such as a solder ball and solder bump, may be attached to the external connection pads 113, which together provide a physical structure that accommodates electrical connections of the semiconductor package with components, wires, leads, terminals, and the like that are external to the semiconductor package.

Various types of substrates, such as a printed circuit board (PCB), a flexible substrate, a tape substrate, or other such substrates known in the art may be used as the package substrate 110. The package substrate 110 may include a flexible PCB in which the internal wirings IC are arranged, a rigid PCB, or a combination thereof.

The first semiconductor chip 120-1 may be mounted on the package substrate 110. The first semiconductor chip 120-1 may include an upper pad 121-1 provided at a top surface thereof, a lower pad 123-1 provided at a bottom surface thereof, and a through silicon via (TSV). On first semiconductor chip 120-1, the bottom surface is the opposite top surface. The bottom of the first semiconductor chip 120-1 may be bonded to the top of the package substrate 110 by a die-attach process. FIG. 1 shows that the die-attach process is performed through the solder balls 115. Alternatively, the die-attach process may be performed by adhesive bonding or sintering.

According to an embodiment of the inventive concept, a clad metal 125-1 may be provided on the upper pad 121-1 of the first semiconductor chip 120-1 to facilitate soldering. The clad metal 125-1 is utilized to enable a bonding process where zincation or ENIG has not been performed, which would otherwise be difficult to perform directly on upper pad 121-1. Ultrasonic bonding may be used to bond the clad metal 125-1 to the upper pad 121-1 of the first semiconductor chip 120-1. Alternatively, thermal energy may be used to bond the metal clad 125-1 to the upper pad 121-1, in which case subsequent heat treatment may be performed. The clad metal 125-1 may be formed from one or more metal layers, and a metal layer in contact with the upper pad 121-1 of the first semiconductor chip 120-1 among the one or more metal layers forming the clad metal 125-1 may be formed of the same metal as the upper pad 121-1. In addition, the clad metal 125-1 may include one or more types of metal.

A solder ball 127-1 may be provided on the clad metal 125-1. The solder ball 127-1 may be a Sn—Pb alloy including Pb or a Pb-free solder alloy not including Pb, in various embodiments. In addition, the Pb-free solder alloy may be an Sn-based alloy having a low melting point or an Au-based alloy having a relatively high melting point.

The second semiconductor chip 120-2 may be mounted on the first semiconductor chip 120-1. The structure of the second semiconductor chip 120-2 may be substantially the same as that of the first semiconductor chip 120-1, but this need not be the case in all embodiments. The second semiconductor chip 120-2 may include an upper pad 121-2 provided at a top surface thereof, a lower pad 123-2 provided at a bottom surface thereof, and a TSV connecting the upper pad 121-2 and the lower pad 123-2. On second semiconductor chip 120-2, the bottom surface is opposite the top surface. The first semiconductor chip 120-1 and the second semiconductor chip 120-2 may be electrically connected through the clad metal 125-1 and the solder ball 127-1.

Figure 2:
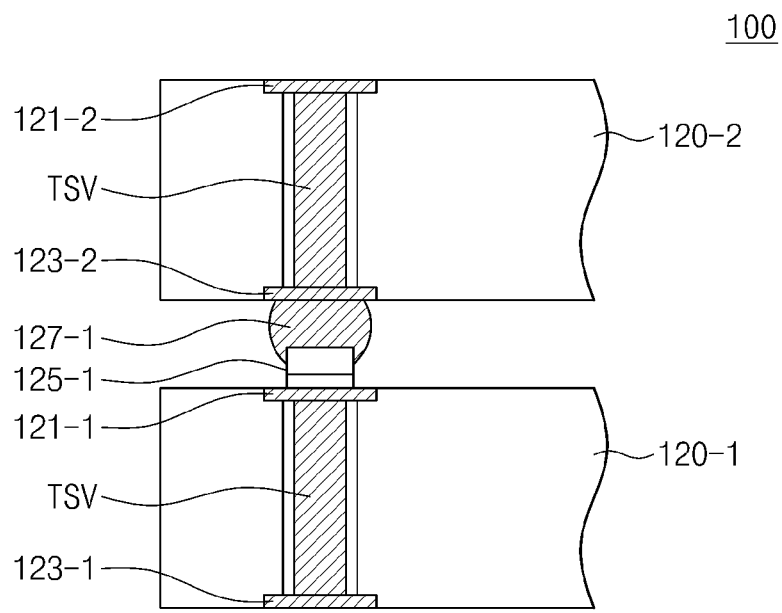
FIG. 2 is an enlarged cross-sectional view of a portion of the embodiment of the semiconductor package in FIG. 1, according to aspects of the inventive concept.

FIG. 2 is an enlarged cross-sectional view of a portion of the semiconductor package 100 of FIG. 1, showing portions of first semiconductor chip 120-1 and second semiconductor chip 120-2.

Referring to FIG. 2, the clad metal 125-1 may be provided on the upper pad 121-1 of the first semiconductor chip 120-1. In this aspect of the inventive concept, typical deposition, patterning, and etching processes may not and need not be performed on the surface of the upper pad 121-1. The clad metal 125-1 may include a homogeneous layer or heterogeneous layers of metal. The clad metal 125-1 shown in FIG. 2 comprises two metal layers. However, any number of metals layers may be used to form the clad metal 125-1. In various embodiments, layers of metal forming the clad metal 125-1 may include one of aluminum (Al), beryllium (Be), copper (Cu), germanium (Ge), gold (Au), iron (Fe), magnesium (Mg), molybdenum (Mo), nickel (Ni), palladium (Pd), platinum (Pt), silicon (Si), silver (Ag), tantalum (Ta), tin (Sn), titanium (Ti), tungsten (W) or zirconium (Zr), or a combination of two or more thereof. For example, the metal layers forming the clad metal 125-1 may be bonded by ultrasonic bonding. However, the inventive concept is not limited thereto and the clad metal 125-1 may be formed by a laminating, sputtering, plating, chemical or other method.

According to an embodiment of the inventive concept, it is possible to manufacture a semiconductor package without expensive deposition, patterning, etching and passivation processes that are used to form the upper pad of a semiconductor chip or under bump metallization (UBM) when a typical semiconductor package is manufactured. Instead, the clad metal is bonded to the upper pad 121-1 of the semiconductor chip 120-1 to facilitate mounting the semiconductor chip 120-1. As a result, it is possible to reduce the costs of semiconductor package manufacturing processes, enhance the strength of a bonding portion and reduce thermal resistance.

FIGS. 3A to 3F are enlarged cross-sectional views of different embodiments of the structure of a clad metal according to various aspects of the inventive concept.

Referring to FIGS. 3A to 3F, the clad metal 125-1 may include a plurality of metal layers. Although FIGS. 3A to 3F show the clad metal 125-1 to include two metal layers, the inventive concept is not limited thereto. A recess may be formed in a portion at which the clad metal 125-1 is bonded to the solder ball 127-1 (see FIG. 2). The recess may be formed to increase a cross-sectional area in which the clad metal 125-1 is in contact with the solder ball 127-1, thereby facilitating improved bonding.

The recess may comprise one or more grooves in the layer and is not limited to those shown in FIGS. 3A to 3F and may be formed in various other forms in order to increase a surface area between the clad metal 125-1 and the solder ball. The recess may extend fully or partially across a width of the layer. In addition, the recess may be formed only on a second metal layer, $2^{nd}$, of the clad metal 125-1, and formed so that a first metal layer, $1^{st}$, is not exposed, e.g., to the solder ball 127-1.

When the clad metal 125-1 includes three or more layers, the recess may be formed only on the uppermost metal layer. Alternatively, it may be formed on remaining metal layers excluding the lowermost metal layer so that a top surface of the lowermost metal layer, here the $1^{st}$ layer, is not exposed, e.g., to the solder ball 127-1.

Figure 3A:
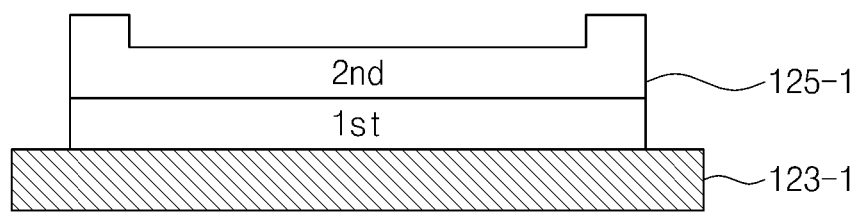
FIGS. 3A to 3F are enlarged cross-sectional views of embodiments of a structure of a clad metal according to aspects of the inventive concept.
Figure 3B:
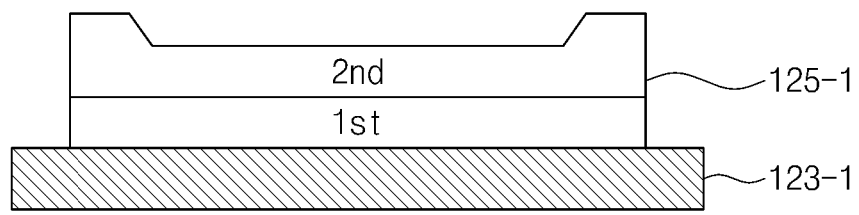
Figure 3C:
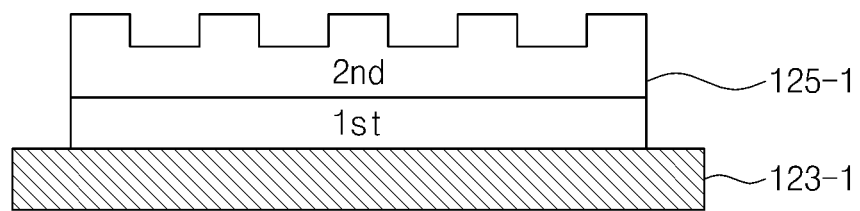
Figure 3D:
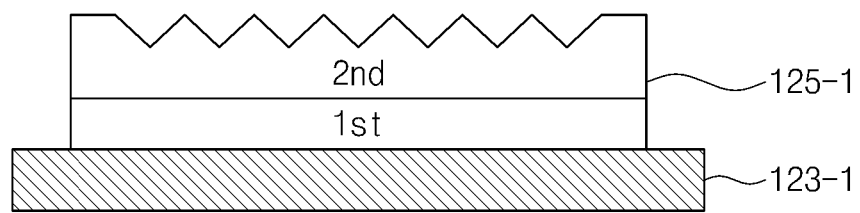
Figure 3E:
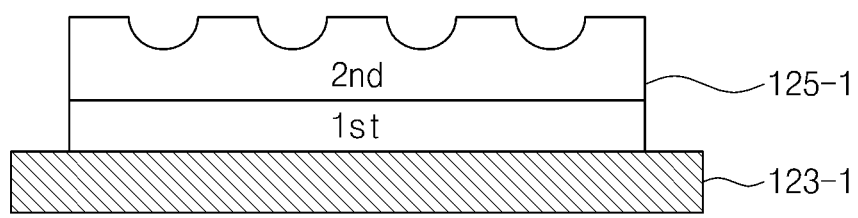
Figure 3F:
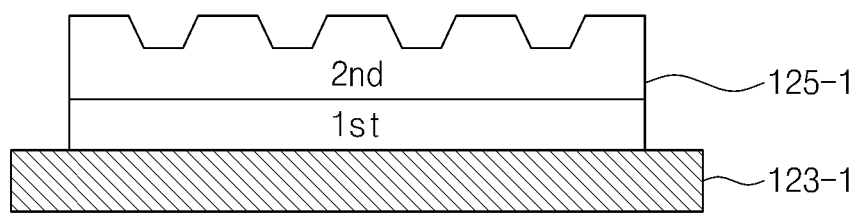

As shown in FIGS. 3A to 3F, the grooves may have vertical, angled, or curved sides and flat., curved, or angled bottoms. For instance, FIGS. 3A and 3C show grooves with vertical sides, and horizontal (or flat) bottoms. FIGS. 3B and 3F show grooves with angled sides, and horizontal (or flat) bottoms. FIG. 3D shows grooves with angled sides with no flat bottoms, which can be referred to as angled bottoms or simply as V-grooves. FIG. 3E shows grooves having a curved form, where the bottom and sides walls of the grooves are part of the curved form.

Figure 4:
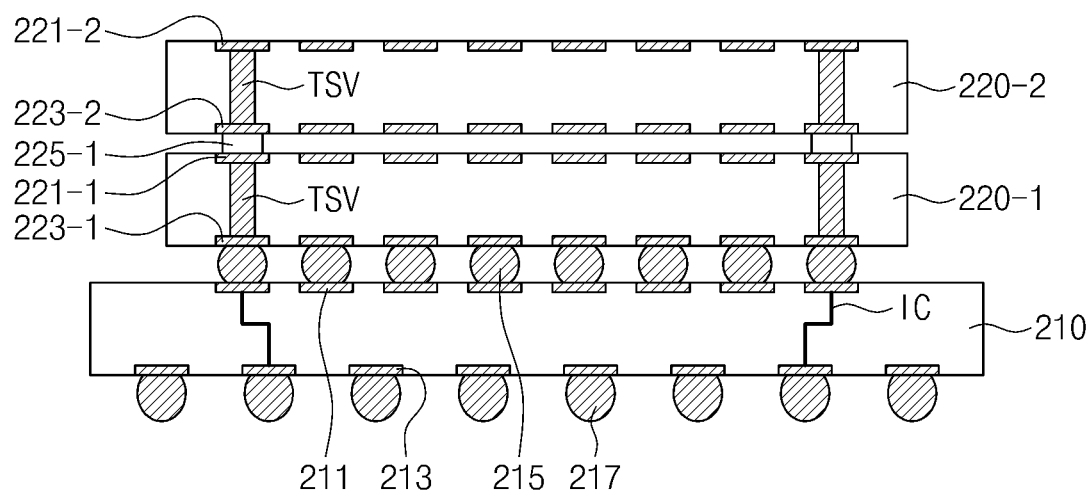
FIG. 4 is a cross-sectional view of an embodiment of a semiconductor package according to aspects of the inventive concept.

FIG. 4 is a cross-sectional view of another embodiment of a semiconductor package according to aspects of the inventive concept. A semiconductor package 200 may include a package substrate 210, a first semiconductor chip 220-1, and a second semiconductor chip 220-2.

The first semiconductor chip 220-1 may be mounted on the package substrate 210. Since the first semiconductor chip 220-1 may be mounted on the package substrate 110 in a similar manner to the method described with respect to FIG. 1, repetitive descriptions are not provided.

A clad metal 225-1 may be provided on the upper pad 221-1 of the first semiconductor chip 220-1. In this case, deposition, patterning and etching processes need not be performed on the surface of the upper pad 221-1. In the alternative, the clad metal 225-1 may be bonded to the upper pad 221-1 by using ultrasonic bonding or thermal energy, in which case, subsequent heat treatment may be performed. The clad metal 225-1 may be fainted from one or more metal layers, and a metal layer being in contact with the upper pad 221-1 of the first semiconductor chip 220-1 among the one or more metal layers forming the clad metal 225-1 may be formed of the same metal as the upper pad 221-1. In addition, the clad metal 225-1 may include one or more types of metals, as discussed above with respect to metal layer 125-1.

The second semiconductor chip 220-2 may be mounted on the first semiconductor chip 220-1. In this embodiment, a solder ball may not be provided between the clad metal 225-1 and the second semiconductor chip 220-2. In the alternative, a lower pad 223-2 of the second semiconductor chip 220-2 may be bonded to the clad metal 225-1 by ultrasonic bonding. The clad metal 225-1 may be formed from one or more metal layers, and a metal layer being in contact with the lower pad 223-2 of the second semiconductor chip 220-2 among the one or more metal layers forming the clad metal 225-1 may be formed of the same metal as the lower pad 223-2. The lower pad 223-2 may be bonded to the clad metal 225-1 by using ultrasonic bonding or thermal energy, in which case, subsequent heat treatment may be performed. For example, when the clad metal 225-1 is bonded to the lower pad 223-2 by ultrasonic bonding, it is possible to ensure excellent thermal, electrical, and mechanical reliability because a bonding material is not used.

Figure 5:
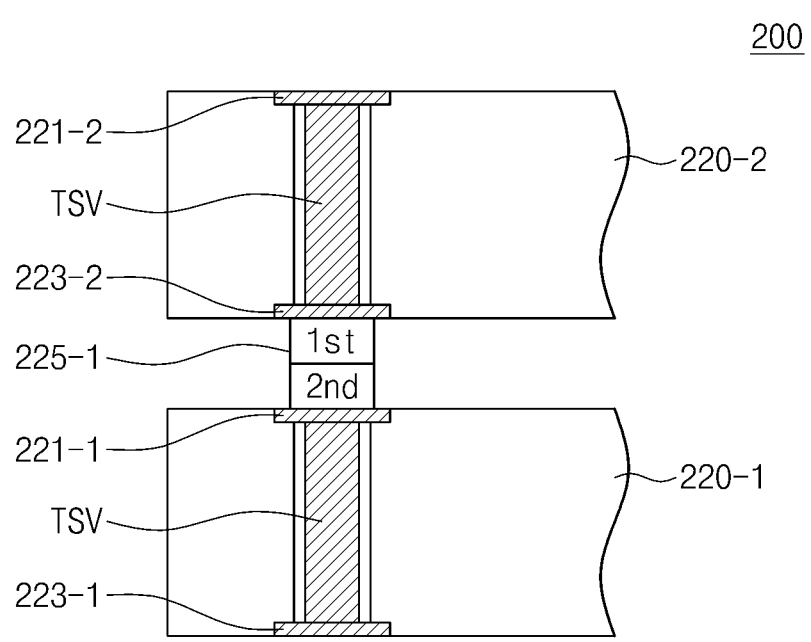
FIG. 5 is an enlarged cross-sectional view of a portion of the embodiment of the semiconductor package in FIG. 4, according to aspects of the inventive concept.

FIG. 5 is an enlarged cross-sectional view of a portion of the semiconductor package 200 of FIG. 4, showing portions of first semiconductor chip 220-1 and second semiconductor chip 220-2.

The clad metal 225-1 may include a homogeneous layer or heterogeneous layers of metal. The clad metal 225-1 shown in FIG. 5 comprises two metal layers. However, any number of metal layers may be used to faun the clad metal 225-1. In various embodiments, layers of metal forming the clad metal 225-1 may include one of aluminum (Al), beryllium (Be), copper (Cu), germanium (Ge), gold (Au), iron (Fe), magnesium (Mg), molybdenum (Mo), nickel (Ni), palladium (Pd), platinum (Pt), silicon (Si), silver (Ag), tantalum (Ta), tin (Sn), titanium (Ti), tungsten (W) or zirconium (Zr), or a combination of two or more thereof. For example, in some embodiments, a first layer of the clad metal may be any one of titanium (Ti), nickel (Ni) and silver (Ag), or an alloy thereof, and a second layer may be aluminum (Al). Metal layers forming the clad metal 225-1 may be bonded by ultrasonic bonding. However, the inventive concept is not limited thereto and the clad metal 225-1 may be formed by a laminating, sputtering, plating, chemical or other method.

According to aspects of the inventive concept, it is possible to manufacture a package without deposition, patterning, etching, passivation and/or soldering processes that are used to form the upper pad of a semiconductor chip or UBM when a typical semiconductor package is manufactured. Instead, the clad metal 225-1 can be bonded to the upper pad 221-1 of the semiconductor chip 220-1 to facilitate mounting of the semiconductor chip 220-2. As a result, it is possible to reduce the costs of package processes and enhance the strength and reliability of the semiconductor package.

Figure 6:
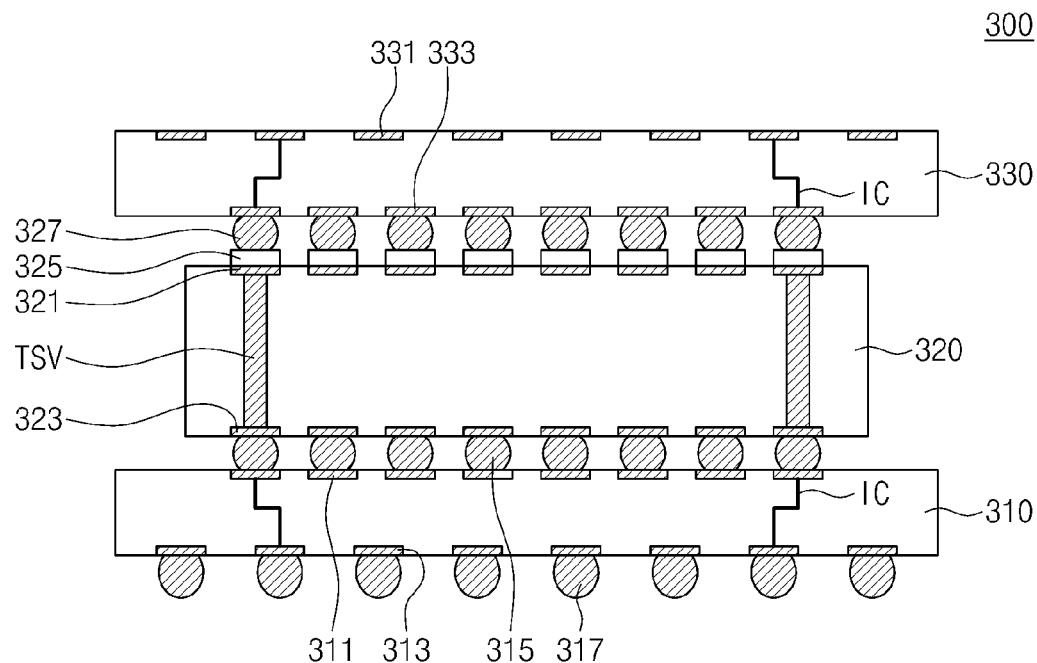
FIG. 6 is a cross-sectional view of an embodiment of a semiconductor package according to aspects of the inventive concept.

FIG. 6 is a cross-sectional view of another embodiment of a semiconductor package according to aspects of the inventive concept. The semiconductor package 300 in FIG. 6 is a dual-sided package and may include a first package substrate 310, a semiconductor chip 320, and a second package substrate 330. Although FIG. 6 shows that only one semiconductor chip is stacked, two or more semiconductor chips may also be stacked in the semiconductor package 300, in accordance with the inventive concept.

The first package substrate 310 may have a top surface and a bottom surface and may include bonding pads 311, internal wirings IC and external connection pads 313. The bonding pads 311 may be arranged at the top surface of the first package substrate 310 and the external connection pads 313 may be arranged at the bottom surface of the first package substrate 310. The bonding pads 311 may be electrically connected to the external connection pads 313 through the internal wirings IC. External connection terminals 317, such as, for example, a solder ball or solder bump, may be attached to the external connection pads 313.

The semiconductor chip 320 may be mounted on the first package substrate 310. The semiconductor chip 320 may include an upper pad 321 provided at a top surface thereof, a lower pad 323 provided at a bottom surface thereof, and a through silicon via (TSV). The bottom surface is the opposite surface of the top surface. The bottom surface of the semiconductor chip 320 may be bonded to the top surface of the first package substrate 310 by a die-attach process. For example, the die-attach process may be performed by soldering, adhesive bonding or sintering.

A clad metal 325 may be provided on the upper pad 321 of the semiconductor chip 320 and may be used to facilitate soldering. The clad metal 325 may be bonded to the upper pad 321 of the semiconductor chip 320 by using ultrasonic bonding. Alternatively, the clad metal 325 may be bonded to the upper pad 321-1 by using thermal energy, in which case subsequent heat treatment may be performed. The clad metal 325 may be formed from one or more metal layers, and a metal layer being in contact with the upper pad 321 of the semiconductor chip 320 among the one or more metal layers forming the clad metal 325 may be formed of the same type of metal as the upper pad 321. However, they may also be different from each other.

The clad metal 325 may include a homogeneous layer or multiple heterogeneous layers of metal. For example, layers of metal forming the clad metal 325 may include one of aluminum (Al), beryllium (Be), copper (Cu), germanium (Ge), gold (Au), iron (Fe), magnesium (Mg), molybdenum (Mo), nickel (Ni), palladium (Pd), platinum (Pt), silicon (Si), silver (Ag), tantalum (Ta), tin (Sn), titanium (Ti), tungsten (W), or zirconium (Zr), or a combination of two or more thereof. The metal layers forming the clad metal 325 may, for example, be bonded by ultrasonic bonding. However, the inventive concept is not limited thereto and the clad metal 325 may be formed by a laminating, sputtering, plating, chemical or other methods.

As discussed above with respect to FIGS. 3A-3F, a recess, which can include one or more grooves, may be formed on a surface of the clad metal 325 that is in contact with the solder ball 327. The recess facilitates the bonding of the clad metal 325 to the solder ball 327 and may be substantially the same as those shown in FIGS. 3A to 3F. Thus, repetitive descriptions are not provided.

The clad metal 325 may be formed from one or more metal layers, and a metal layer being in contact with the upper pad 321 of the semiconductor chip 320 among the one or more metal layers forming the clad metal 325 may be formed of the same type of metal as the upper pad 321. In some cases, when a soldering process is desired to be performed on the upper pad 321 of the semiconductor chip 320 formed of, for example, aluminum (Al), soldering may be difficult as a result of the characteristics of the pad material. Thus, use of the clad metal 325 into between the solder ball 327 and the upper pad 321 of the semiconductor chip 320 facilitates the soldering process.

The second package substrate 330 may be mounted on the semiconductor chip 320. For example, the second package substrate 330 may be mounted by a flip-chip process. In this case, the solder ball 327 may be provided between the clad metal 325 and the bottom of the second package substrate.

The second package substrate 330 may have a top surface and a bottom surface and may include external connection pads 331, internal wirings IC and bonding pads 333. The external connection pads 331 may be arranged at the top surface of the package substrate 330 and the bonding pads 333 may be arranged at the bottom surface of the package substrate 330. The bonding pads 333 may be electrically connected to the external connection pads 331 through the internal wirings IC. Although not shown, external connection terminals such as, for example, a solder ball or solder bump, may be attached to the external connection pads 331.

According to a dual-sided package according to an embodiment of the inventive concept, when the semiconductor chip is mounted on the package substrate or, vice versa, by a flip-chip process, the clad metal 325 may be provided between the semiconductor chip 320 and the package substrate 310, 330. Thus, it is possible to manufacture a semiconductor package without expensive deposition, patterning, etching, and passivation processes that are used to form the upper pad of a semiconductor chip or UBM. As a result, it is possible to reduce the costs of package processes, enhance the strength of a bonding portion and reduce thermal resistance. In addition, since heat is emitted through the two package substrates provided at the top and bottom of the semiconductor chip, it is possible to enhance the reliability of the semiconductor package.

In the case of a package manufactured by a general wire bonding process, it may be difficult to sufficiently emit heat from the semiconductor chip because heat is emitted only through a package substrate. However, according to the dual-sided package according to an embodiment of the inventive concept, it is possible to efficiently emit heat through the first package substrate and the second package substrate. Accordingly, a manufactured dual-sided package may be applied to a semiconductor device needing efficient heat emission, such as a power management integrated circuit (PMIC).

Figure 7:
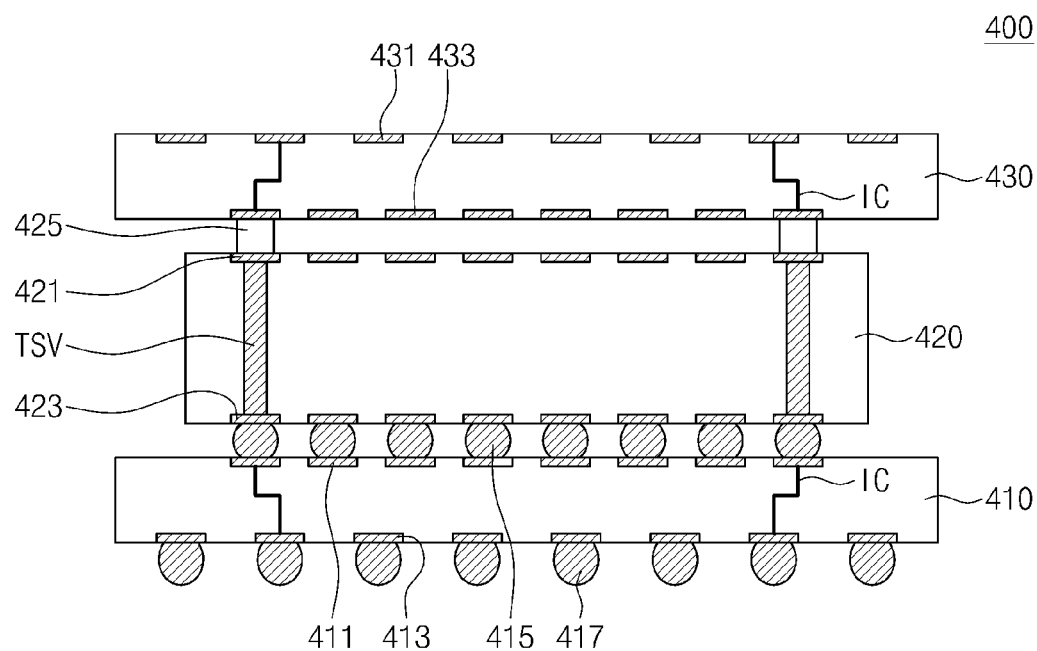
FIG. 7 is a cross-sectional view of an embodiment of a semiconductor package according to aspects of the inventive concept.

FIG. 7 is a cross-sectional view of another embodiment of a semiconductor package according to aspects of the inventive concept. A semiconductor package 400 in FIG. 7 is a dual-sided package and may include a first package substrate 410, a semiconductor chip 420, and a second package substrate 430. Although FIG. 7 shows only one semiconductor chip as an example, the inventive concept is not limited thereto.

The semiconductor chip 420 may be mounted on the first package substrate 410. Since the semiconductor chip 420 may be mounted on the first package substrate 410 in a similar manner as that described with respect to FIG. 6, repetitive descriptions are not provided.

The clad metal 425 may be provided on the upper pad 421 of the semiconductor chip 420 and may be used to facilitate soldering. The clad metal 425 may be bonded to the upper pad 421 of the semiconductor chip 420 by using ultrasonic bonding. Alternatively, the clad metal 425 may be bonded to the upper pad 421 by using thermal energy, in which case subsequent heat treatment may be performed. The clad metal 425 may be formed from one or more metal layers, and a metal layer being in contact with the upper pad 421 of the semiconductor chip 420 among the one or more metal layers forming the clad metal 425 may be formed of the same type of metal as the upper pad 421. However, they may also be different from each other.

The clad metal 425 may include a homogeneous layer or heterogeneous layers of metal. For example, layers of metal forming the clad metal 425 may include one of aluminum (Al), beryllium (Be), copper (Cu), germanium (Ge), gold (Au), iron (Fe), magnesium (Mg), molybdenum (Mo), nickel (Ni), palladium (Pd), platinum (Pt), silicon (Si), silver (Ag), tantalum (Ta), tin (Sn), titanium (Ti), tungsten (W) or zirconium (Zr), or a combination of two or more thereof. For example, the metal layers forming the clad metal 425 may be bonded by ultrasonic bonding. However, the inventive concept is not limited thereto and the clad metal 425 may be formed by a laminating, sputtering, plating, chemical or other methods.

The second package substrate 430 may be mounted on the semiconductor chip 420. The second package substrate 430 may have a top surface and a bottom surface and may include external connection pads 431, internal wirings IC and bonding pads 433. The external connection pads 431 may be arranged at the top surface of the package substrate 430 and the bonding pads 430 may be arranged at the bottom surface of the package substrate 430. The bonding pads 433 may be electrically connected to the external connection pads 431 through the internal wirings IC.

The second package substrate 430 may be mounted by a flip-chip process. For example, the bonding pads 433 of the second package substrate 430 may be bonded to the clad metal 425 by ultrasonic bonding. However, the inventive concept is not limited thereto and adhesive bonding using a non-conductive paste (NCP), a non-conductive film (NCF), and an anisotropic conductive film (ACF) may also be used. In addition, before and after bonding, underfill, NCF and NCP processes may be applied to fill any empty space between the second package substrate 430 and the semiconductor chip 420.

As previously set forth, metal clad 425 may include one or more layers, and a metal layer being in contact with the bonding pads 433 of the second package substrate among the one or more metal layers forming the clad metal 425 may be formed of the same type of metal as the upper pad. However, they may also be different from each other.

When the package substrate is mounted on the semiconductor chip like the dual-sided package embodiment, the clad metal may be provided between the semiconductor chip and the package substrate. Thus, it is possible to manufacture a package without expensive deposition, patterning, etching, and passivation processes that are used to form the upper pad of a semiconductor chip or UBM. As a result, it is possible to reduce the costs of package processes, enhance the strength of a bonding portion and reduce thermal resistance.

In addition, since heat is emitted through the two package substrates provided at the top and bottom of the semiconductor chip, it is possible to enhance the reliability of the semiconductor package.

In some embodiments, the inventive concept may be applied to a solid state drive (SSD).

Figure 8:
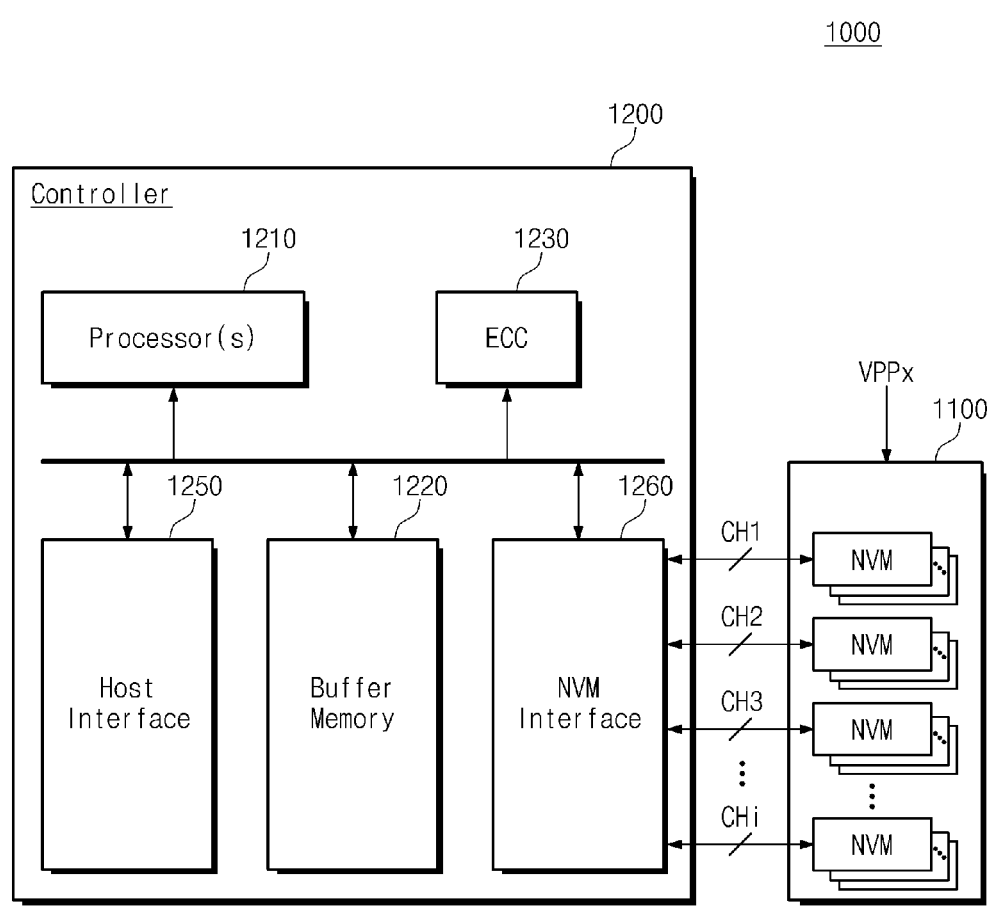
FIG. 8 is an exemplary block diagram of an embodiment of a solid state drive (SSD) according to aspects of the inventive concept.

FIG. 8 is a block diagram of an exemplary embodiment of a SSD according to aspects of the inventive concept. Referring to FIG. 8, an SSD 1000 includes a plurality of non-volatile memory devices 1100 and an SSD controller 1200.

The non-volatile memory devices 1100 may be implemented to optionally receive an external high voltage VPPx. In some embodiments, of the non-volatile memory devices 1100 may be implemented to perform a verification operation, according to aspects of the inventive concept.

The SSD controller 1200 is connected to the non-volatile memory devices 1100 through a plurality of channels CH1 to CHi (where "i" is an integer number equal to or larger than 2). The SSD controller 1200 may include at least one processor 1210, a buffer memory 1220, an error correction circuit (ECC) 1230, a host interface 1250, and a non-volatile memory (NVM) interface 1260.

The buffer memory 1220 may temporarily store data needed for the operation of the memory controller 1200. The buffer memory 1220 may include a plurality of memory lines useful for storing data or commands. In this example, the plurality of memory lines may be mapped to cache lines by using various methods. The buffer memory 1220 may store page bitmap information and read count information. The page bitmap information or the read count information may be read from the non-volatile memory device 1100 upon power-up and updated according to an internal operation. Updated page bitmap information or read count information may regularly or irregularly be stored in the non-volatile memory device 1100.

The error correction circuit 1230 may calculate an error correction code value of data to be programmed in a write operation, error-correct the data read in a read operation, based on the error correction code value, and error-correct data recovered by the non-volatile memory device 1100 in a data recovery operation. Although not shown, a code memory storing code data needed for operating the memory controller 1200 may be further included. The code memory may be implemented in a non-volatile memory device.

The host interface 1250 may provide a function-enabling interface with an external device. In this example, the host interface 1250 may be NAND flash interface, as an example. In addition, the host interface 1250 may be implemented in various interfaces and also may be implemented in a plurality of interfaces. The non-volatile memory interface 1260 may provide a function-enabling interface with the non-volatile memory device 1100.

The SSD 1000 may include embodiments of non-volatile memories manufactured according to aspects of the inventive concept. Thus, it is possible to reduce manufacturing costs, efficiently emit heat, and enhance the reliability of the SSD 1000.

The inventive concept may also be applied to an embedded multimedia card (eMMC), moviNAND memory device, or iNAND memory device.

Figure 9:
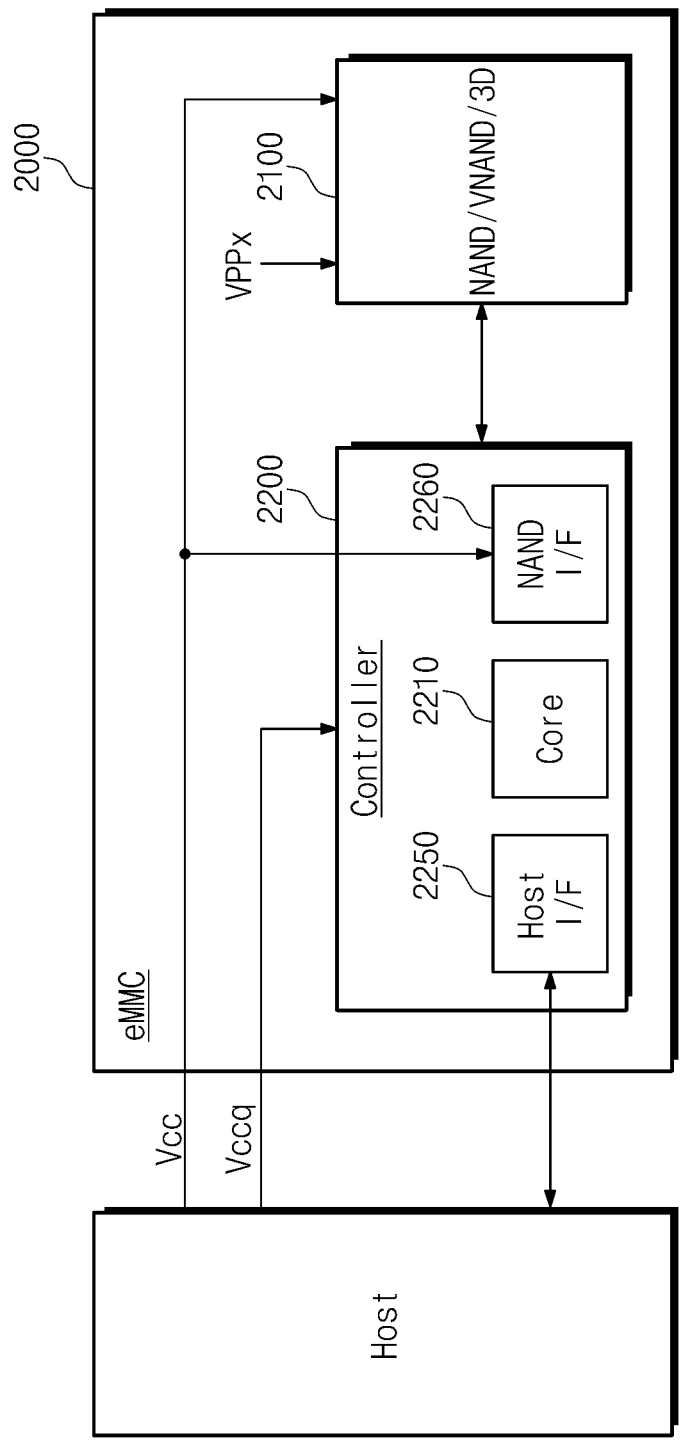
FIG. 9 is an exemplary block diagram of an embodiment of an embedded multi media card (eMMC) according to aspects of the inventive concept.

FIG. 9 is a block diagram of an exemplary embodiment of an eMMC, according to aspects of the inventive concept. Referring to FIG. 9, the eMMC 2000 may include at least one NAND flash memory device 2100 and a controller 2200.

The NAND flash memory device 2100 may include embodiments of non-volatile memories manufactured according to aspects of the inventive concept. Thus, it is possible to reduce manufacturing costs, efficiently emit heat and enhance the reliability of the eMMC.

The memory controller 2200 may be connected to the NAND flash memory device 2100 through a channel, for example. The memory controller 2200 may include at least one controller core 2210, a host interface 2250, and an NAND interface 2260. The at least one controller core 2210 may control the overall operations of the eMMC 2000. The host interface 2250 may enable the controller 2210 to interface with a host that can be external to the eMMC 2000. As examples, the host interface 2250 may be a parallel interface (e.g., MMC interface), a serial interface (e.g., UHS-II or universal flash storage (UFS) interface) or a NAND interface. The NAND interface 2260 may enable the NAND flash memory device 2100 to interface with the controller 2200.

The eMMC 2000 may receive source voltages Vcc and Vccq from the Host. In this example, a first source voltage Vcc (e.g., about 3.3 V) may be provided to the NAND flash memory device 2100 and to the NAND interface 2260, and a second source voltage Vccq (e.g., about 1.8 V) may be provided to the controller 2200. Further, the NAND flash memory device 2100 may optionally receive an external high voltage, VPPx.

The inventive concept may also be applied to embodiments of a Universal Flash Storage (UFS) device.

Figure 10:
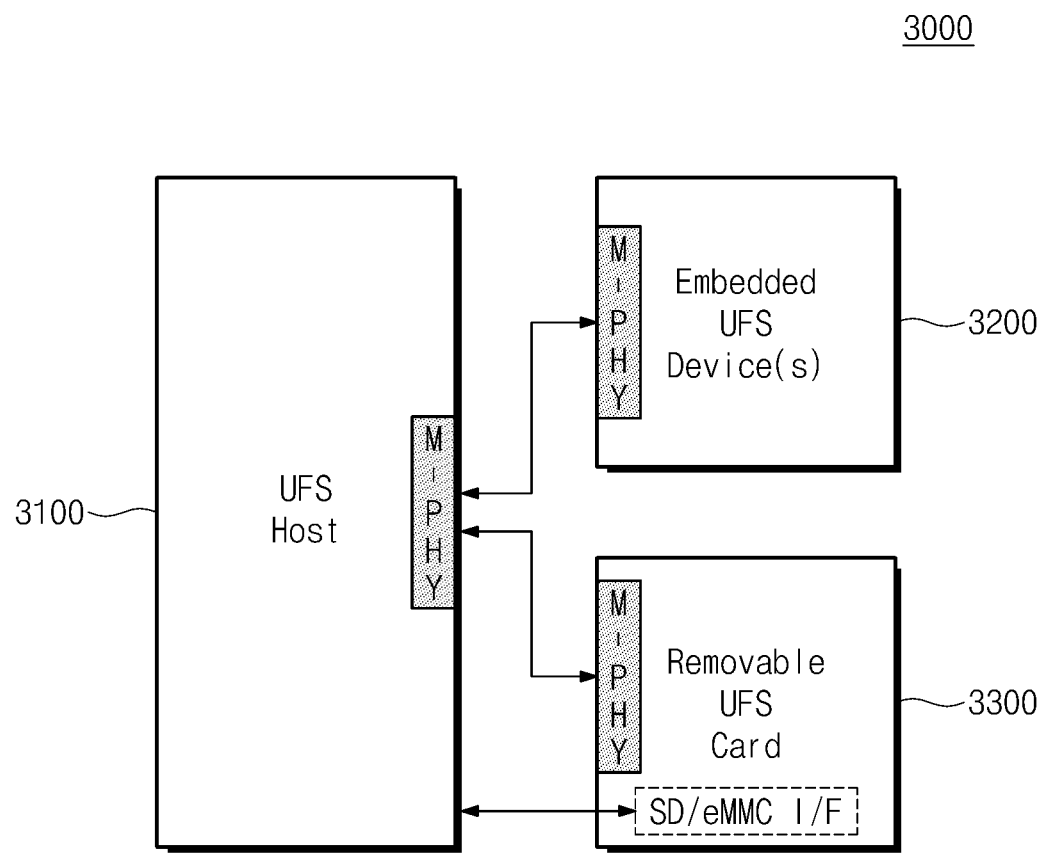
FIG. 10 is an exemplary block diagram of an embodiment of a universal flash storage (UFS) system according to aspects of the inventive concept.

FIG. 10 is a block diagram of an exemplary embodiment of a UFS system according to aspects of the inventive concept. Referring to FIG. 10, a UFS system 3000 may include a UFS host 3100, at least one embedded UFS device 3200, and a detachable UFS card 3300. Communication between the UFS host 3100 and the embedded UFS device 3200 and communication between the UFS host 3100 and the detachable UFS card 3300 may be performed through an M-PHY layer.

At least one of the embedded UFS device 3200 and the detachable UFS card 3300 may include a semiconductor package manufactured according to aspects of the inventive concept.

Alternatively, the host 3100 may include a bridge to allow the detachable UFS card 3300 to communicate by using other protocols excluding a UFS protocol. The UFS host 3100 and the detachable UFS card 3300 may communicate by using various card protocols (e.g., UFDs, MMC, eMMC secure digital (eMMC SD), mini SD, Micro SD).

The inventive concept may also be applied to embodiments of a mobile device.

According to aspects of the inventive concept, it is possible to simplify a process of manufacturing a semiconductor package and enhance the heat emission capability of the semiconductor package.

While embodiments in accordance with the inventive concept have been particularly shown and described with reference to exemplary drawings thereof, it will be understood that various changes in form and details may be made therein without departing from the spirit and scope of the following claims, which cover that shown and described with respect to the figures, as well as physical and/or functional equivalents thereof.

What is claimed is:

1. A semiconductor package comprising:
a first package substrate;
a first semiconductor chip mounted on the first package substrate and having a first pad and a second pad, wherein the first pad is provided on a top of the first semiconductor chip and the second pad is provided on a bottom of the first semiconductor chip, the bottom being an opposite surface of the top;
a clad metal provided on the first pad and electrically connecting the first semiconductor chip to one of a second semiconductor chip and a second package substrate provided on the top of the first semiconductor chip,
wherein the clad metal comprises at least a first layer of metal and a second layer of metal, the first layer of metal with which the clad metal is in contact with the first pad being formed of a same type of metal as the first pad; and
a solder ball provided between the second layer of metal and a second pad of the one of the second semiconductor chip and the second package substrate connected thereto.

2. The semiconductor package of claim 1, wherein a recess is formed in the second layer of metal being in contact with the solder ball.

3. The semiconductor package of claim 1, wherein the clad metal and the first semiconductor chip are connected by ultrasonic bonding.

4. The semiconductor package of claim 1, wherein the clad metal and the one of the second semiconductor chip and the second package substrate is connected by ultrasonic bonding or adhesive bonding.

5. The semiconductor package of claim 1, wherein the second layer of metal at which the clad metal is in contact with the second pad is formed of a same type of metal as the second pad.

6. The semiconductor package of claim 1, wherein the first layer of metal and the second layer of metal are homogeneous or heterogeneous.

7. The semiconductor package of claim 6, wherein the first layer of metal and the second layer of metal each include one of aluminum (Al), beryllium (Be), copper (Cu), germanium (Ge), gold (Au), iron (Fe), magnesium (Mg), molybdenum (Mo), nickel (Ni), palladium (Pd), platinum (Pt), silicon (Si), silver (Ag), tantalum (Ta), tin (Sn), titanium (Ti), tungsten (W), or zirconium (Zr), or a combination of two or more thereof.

8. The semiconductor package of claim 6, wherein the clad metal is formed by at least one of cladding, laminating, sputtering and plating.

9. A semiconductor package comprising:
a first semiconductor chip having a first pad at a first surface thereof;
a clad metal provided on the first pad and configured to electrically connect the first semiconductor device to a component,
wherein the component comprises one of a second semiconductor chip and a package substrate; and
wherein the clad metal comprises at least a first layer of metal and a second layer of metal, the first layer of metal with which the clad metal is in contact with the first pad being formed of a same type of metal as the first pad; and a solder ball provided between the second layer of metal and a second pad of the one of the second semiconductor chip and the package substrate connected thereto.

10. The semiconductor package of claim 9, wherein a recess is formed in the second layer of metal being in contact with the solder ball.

11. A semiconductor package comprising:

a first package substrate;

a first semiconductor chip mounted on the first package substrate and having a first pad and a second pad, wherein the first pad is provided on a top of the first semiconductor chip and the second pad is provided on a bottom of the first semiconductor chip, the bottom being an opposite surface of the top;

a clad metal provided on the first pad and electrically connecting the first semiconductor chip to one of a second semiconductor chip and a second package substrate provided on the top of the first semiconductor chip, the clad metal comprising at least a first layer of metal and a second layer of metal, the first layer of metal with which the clad metal is in contact with the first pad being formed of a same type of metal as the first pad; and a solder ball provided between the second layer of metal and a second pad of the one of the second semiconductor chip and the second package substrate connected thereto.

12. The semiconductor package of claim 11, wherein a recess is formed in the second layer of metal being in contact with the solder ball.

13. The semiconductor package of claim 11, wherein the second layer of metal at which the clad metal is in contact with the second pad is formed of a same type of metal as the second pad.

14. The semiconductor package of claim 11, wherein the first layer of metal and the second layer of metal are homogeneous or heterogeneous.

15. The semiconductor package of claim 14, wherein the first layer of metal and the second layer of metal each include one of aluminum (Al), beryllium (Be), copper (Cu), germanium (Ge), gold (Au), iron (Fe), magnesium (Mg), molybdenum (Mo), nickel (Ni), palladium (Pd), platinum (Pt), silicon (Si), silver (Ag), tantalum (Ta), tin (Sn), titanium (Ti), tungsten (W), or zirconium (Zr), or a combination of two or more thereof.

* * * * *